United States Patent [19]

Harnden, Jr. et al.

[11] Patent Number: 4,471,300

[45] Date of Patent: Sep. 11, 1984

[54] LDC HOOK-ON DIGITAL AMMETER

[75] Inventors: John D. Harnden, Jr.; William P. Kornrumpf, both of Schenectady, N.Y.

[73] Assignee: General Electric Company, Schenectady, N.Y.

[21] Appl. No.: 286,490

[22] Filed: Jul. 24, 1981

[51] Int. Cl.³ .................... G01R 1/20; G01R 15/00
[52] U.S. Cl. ................................ 324/127; 324/96; 324/122
[58] Field of Search ................ 324/127, 96, 122, 115

[56] References Cited

U.S. PATENT DOCUMENTS

| | | | |
|---|---|---|---|
| 2,146,555 | 2/1939 | Arey | 324/127 |
| 4,060,801 | 11/1977 | Stein et al. | 340/324 R |
| 4,212,011 | 7/1980 | Waldron | 340/784 |
| 4,301,407 | 11/1981 | Koslar | 324/96 |

OTHER PUBLICATIONS

"GE Test Instruments" brochure GEP-372-F, June 30, 1980, pp. 1 and 2.
"General Electric Snapper Slim" brochure GEA-10658 12-79, pp. 1 and 2.
"GE Types 1904, 1905 Hook-On Ammeter-Voltmeter" brochure ID-4810, pp. 1-3 and 7.

*Primary Examiner*—Ernest F. Karlsen
*Attorney, Agent, or Firm*—Marvin Snyder; James C. Davis, Jr.

[57] ABSTRACT

A low cost hook-on ammeter for consumer use includes a split core to be clipped around a conductor. Secondary turns on the core actuate a liquid crystal digital display to indicate alternating current amplitude in the conductor. The liquid crystal display segments may be connected to individual taps on the secondary winding, or to taps on a resistive divider network connected across the entire secondary winding. As current in the conductor increases, secondary voltage increases, turning on an increasing number of segments of the liquid crystal display accordingly.

8 Claims, 3 Drawing Figures

LDC HOOK-ON DIGITAL AMMETER

RELATED APPLICATION

This invention is related to Harnden and Kornrumpf application Ser. No. 286,491 filed July 24, 1981, now U.S. Pat. No. 4,438,396, and assigned to the instant assignee.

INTRODUCTION

This invention relates to inexpensive current measuring equipment, and more particularly to a low cost hook-on ammeter for providing a digital indication of measured alternating current amplitude.

Hook-on ammeters provide convenient means for measuring alternating current amplitude without need to interrupt the circuit in order to insert the measuring apparatus. These ammeters are provided with an annular magnetic core which is typically split into two sections that are hinged together and can be clipped together at their ends opposite the hinged ends. Thus the annular configuration of the core can be opened so as to pass around a current-carrying wire and then be closed so as to reestablish the annular configuration in a manner which now completely encircles the wire. This effectively establishes a single turn primary winding on the core. The alternating field of the AC current in the wire then becomes coupled through the core to a secondary winding wound about the core, establishing an AC voltage in the secondary winding. This voltage drives the indicating needle on an ammeter, which thus can be scaled to provide an indication of current amplitude in the wire being monitored. Such ammeters are sold by General Electric Company, Instrument Products Operation, 40 Federal Street, West Lynn, Mass. under the registered trademark Snapper.

A hook-on ammeter typically employs a current transformer in which the secondary voltage is rectified with an instrument rectifier of the selenium or copper oxide type. This gives rise to a nonlinear rectified output voltage which is normally compensated by utilizing a nonlinear readout scale in conjunction with, for example, a D'Arsonval movement. Instruments of this type have heretofore constituted the only compact portable means for achieving alternating current measurements without requiring that the circuit be interrupted to accommodate the instrument.

In ammeters that use digital readout, linearization of the output current is performed with sample and hold circuits, preferably in linear integrated circuit form. Most types of hook-on ammeters, however, either avoid the need for linear integrated circuits by employing a D'Arsonval movement and nonlinear scale, which provides very poor accuracy at low current levels, or else the ammeter comprises a relatively expensive digital system usually requiring a separate source of power, such as a battery. Nevertheless, the simplicity of using a hook-on digital ammeter, together with its convenient portability and high sensitivity, makes it a desirable candidate for consumer use, especially since the scales on a D'Arsonval movement type instrument are not necessarily easy to read unambiguously under all conditions. It would be desirable, therefore, to employ a hook-on ammeter having digital output indication, if the instrument can be significantly reduced in cost. Moreover, elimination of the D'Arsonval movement would tend to reduce weight of the instrument.

Accordingly, one object of the invention is to provide a lightweight, low cost, hook-on ammeter.

Another object is to provide a digital hook-on ammeter requiring no internal power supply.

Another object is to provide a portable, rugged, AC ammeter which is simple to operate.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

Briefly, in accordance with a preferred embodiment of the invention, a hook-on digital ammeter comprises an annular magnetic core interrupted at at least one location such that the core material at opposite sides of the interruption is sufficiently separable to allow passage of a conductor through the interruption. A secondary winding is wound on the core. Liquid crystal display means having a plurality of display segments are provided, together with circuit means coupling each segment of the liquid crystal display means to the secondary winding means. The circuit means energizes selected segments of the liquid crystal display means in accordance with the voltage across the turns of the secondary winding.

DESCRIPTION OF PREFERRED EMBODIMENTS

Figure 1:
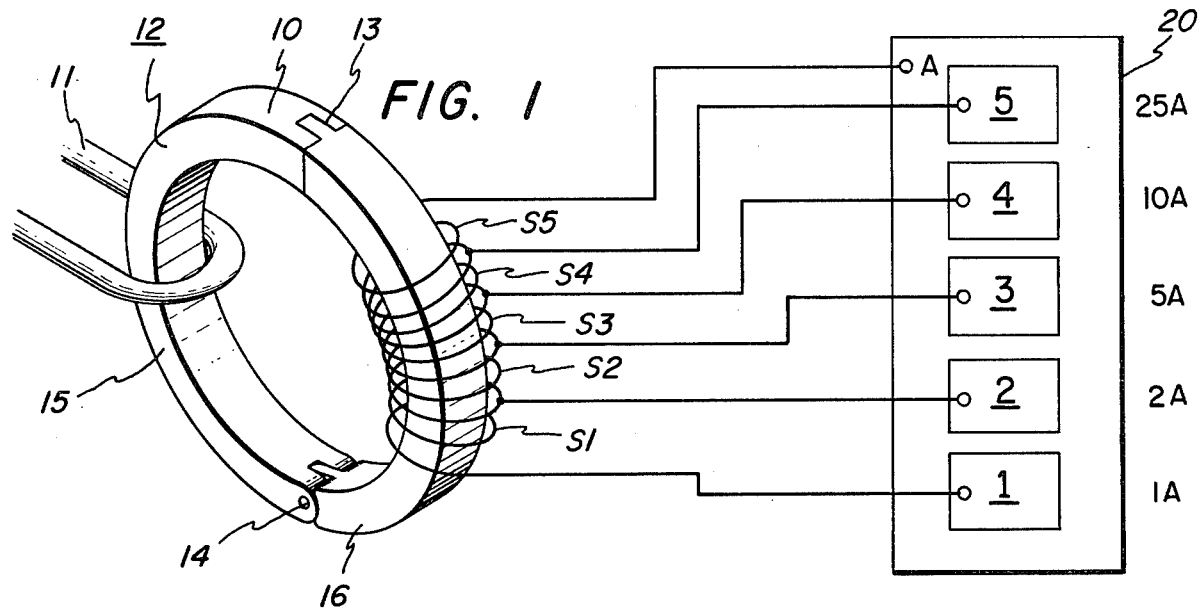
FIG. 1 is a schematic drawing of a first embodiment of the invention.

FIG. 1 illustrates one embodiment of the hook-on ammeter described herein, capable of indicating the approximate amount of current in a given AC conductor. The ammeter employs a clip-on core 10 (shown in its closed, or completely annular, condition) having a single turn primary winding 11 thereon carrying alternating current intended to be measured. To make this measurement, core 10, shown fabricated in two segments 15 and 16, is first opened at its dovetail segment ends 13, which segments are pivoted about a hinge pin 14 at the opposite segment ends. The open core is next passed over conductor 11, and then reclosed at its dovetail segment ends 13. Other types of joints, including mortise and tenon joints of other than dovetail configuration may, alternatively, be employed, as long as the joint, while closed, exhibits high permeability which is relatively invariant with use of the instrument. A plurality of secondary windings S1-S5 wound about core 10 are connected electrically in series and coupled magnetically in series-aiding fashion. Those skilled in the art will recognize that there are many different ways in which annular core 10 may be constructed to achieve an opening to allow the core to be passed over a conductor in which alternating current is to be measured, and to achieve a completely closed loop of high permeability after the core has been passed over the conductor. Moreover, in addition to being fabricated of conventional magnetic steel, core 10 may, alternatively, be fabricated of amorphous metal tape as described in Becker et al. U.S. Pat. No. 4,116,728, issued Sept. 26, 1978 and assigned to the instant assignee. In the case of such amorphous metal core, the annulus need be interrupted at only one location, since the flexibility of the core would permit the interruption to be manually enlarged so as to admit a conductor into the center of the core and thereafter be reclosed manually.

A five-segment liquid crystal display 20, of the type shown and described, for example, in C. R. Stein et al. U.S. Pat. No. 4,060,801, issued Nov. 29, 1977 and assigned to the instant assignee, is connected to the secondary windings S1–S5 in a fashion which linearizes the otherwise nonlinear voltage produced by the nonideal current transformer 12 comprised of core 10 and the primary and secondary windings thereon. Thus output voltage across windings S1–S5 drives liquid crystal display bargraph section 1, output voltage across windings S2–S5 drives bargraph section 2, output voltage across windings S3–S5 drives bargraph section 3, output voltage across windings S4 and S5 drives bargraph section 4, and output voltage across winding S5 drives bargraph section 5 while the other end of winding S5 is connected to terminal A of liquid crystal display 14. Terminal A is, in turn, connected to the common anode (not shown) for the entire liquid crystal display 20. For convenience in reading the instrument, bargraph sections 1–5 may be wired to indicate currents of 1 amp, 2 amps, 5 amps, 10 amps and 25 amps, respectively, as indicated by designations alongside the respective bargraph sections shown in FIG. 1, although essentially any appropriate readout scheme can be established by using the appropriate number of turns on each of the secondary windings. In this fashion, the linearizing and signal conditioning normally required for digital readout of this type of signal is eliminated by making use of the voltage turn-on characteristic of the liquid crystal display. "Turn-on" is herein meant to indicate activation from one optically responsive state to another; e.g., from the dark or optically absorbent state to the light or optically transmissive state.

Specifically, at low current in conductor 11, the voltage generated across windings S5, S4, S3, S2 and S1 is sufficient to turn on bargraph section 1, but insufficient to turn on any of the other bargraph sections 2–5. As current in conductor 11 increases, however, the voltage generated across windings S5, S4, S3, and S2 is sufficient to turn on bargraph section 2, leaving bargraph section 1 in its turned-on condition, but is insufficient to turn on any of bargraph sections 3–5. As current in conductor 11 increases still further, the voltage across windings S5, S4 and S3 becomes sufficient to turn on bargraph section 3, leaving bargraph sections 1 and 2 in their turned-on conditions, but is insufficient to turn on either of bargraph sections 4 and 5. As current in conductor 11 continues to increase, the voltage across windings S5 and S4 becomes sufficient to turn on bargraph section 4, leaving bargraph sections 1–3 in their turned-on conditions, but is insufficient to turn on bargraph section 5. When current in conductor 11 finally increases to a sufficiently high level, the voltage across winding S5 becomes sufficient to turn on bargraph section 5, leaving bargraph sections 1–4 in their turned-on conditions. In the event current through conductor 11 should fall off, the bargraph sections would turn off in the reverse of the order described for turn-on; i.e., the energized bargraph section requiring the highest secondary winding voltage for turn-on would turn off first, the energized secondary winding requiring the next highest secondary winding voltage for turn-on would turn off next, etc. In the example given for the turn-on sequence described above, the turn-off sequence would be first bargraph section 5, next bargraph section 4, then bargraph section 3, bargraph section 2, and finally bargraph section 1.

Those skilled in the art will recognize that if transformer 12 were an ideal current transformer, then the ratio of secondary to primary turns required to energize bargraph section 1 would be two times that for section 2, five times that for section 3, 10 times that for section 4 and twenty-five times that for section 5. However, due to magnetic characteristics of the core, as well as other transformer nonlinearities well known to those skilled in the art, transformer 12 is not an ideal current transformer and therefore the turns ratios must be slightly altered from the ideal values to compensate for this fact. Such turns ratio modification may be easily accomplished for any given model of ammeter by simple trial and error and, once established, may be standardized for such model without causing any significant deviation in current readings between different ammeters of that model.

Figure 2:
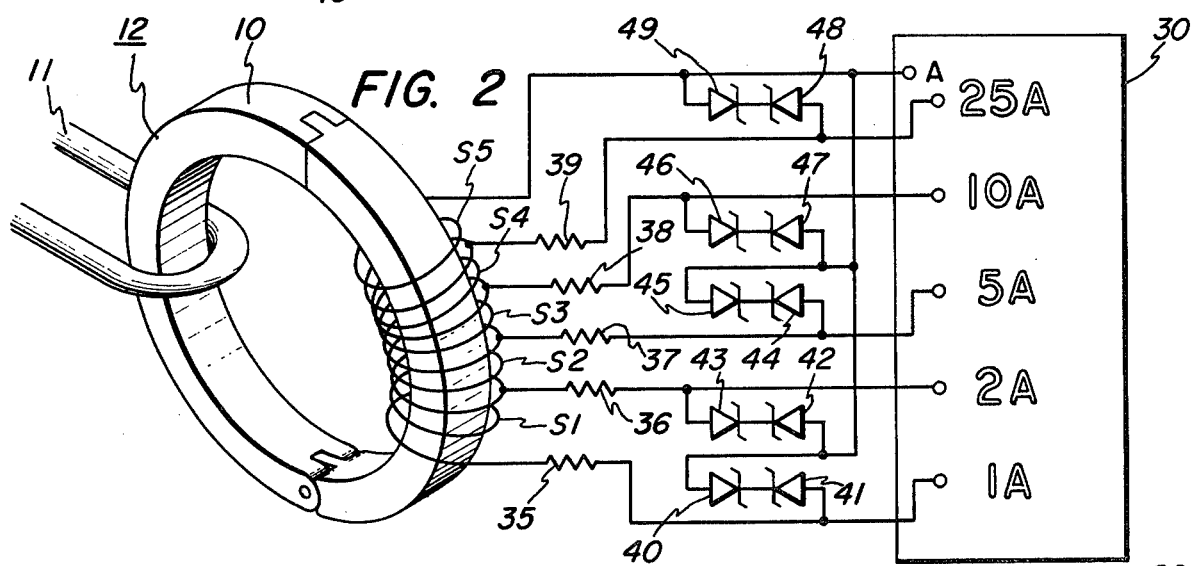
FIG. 2 is a schematic drawing of a second embodiment of the invention in which the display is protected against excessive voltages.

The embodiment of FIG. 2 constitutes a modification of that shown in FIG. 1 in that a combination resistor-zener diode network is employed to limit the maximum voltage on each segment of the liquid crystal display and, in addition, each of the segments of liquid crystal display 30 is shown in the form of alphanumerics (although exclusively numerals may be used, if preferred, by omitting the accompanying amp designations A). Thus transformer 12 is similar to that shown in FIG. 1. However, the connections from transformer 12 to each of the 1A, 2A, 5A, 10A and 25A segments of liquid crystal display 30 in the circuit of FIG. 2 is made through a resistance 35, 36, 37, 38 and 39, respectively, connected to one side of windings S1, S2, S3, S4 and S5, respectively. Additionally, each of resistances 35, 36, 37, 38 and 39 is coupled through a pair of parallel-opposed zener diodes 40 and 41, 42 and 43, 44 and 45, 46 and 47, and 48 and 49, respectively, to anode terminal A which, in turn, is wired to the other side of secondary winding S5.

Operation of the circuit shown in FIG. 2 occurs in a manner similar to that described for the circuit of FIG. 1. However, in the event an excessively large voltage, with respect to the anode terminal A voltage, appears across any of the secondary windings, the forward or reverse-connected zener diode associated therewith (depending upon the instantaneous AC voltage polarity) breaks down so as to conduct current to or from the anode, depending again upon the instantaneous voltage polarity, thereby increasing the voltage drop across the resistance respectively coupled thereto so as to establish a limit on the maximum voltage applied through that resistance to liquid crystal display 30. In this fashion, each segment of liquid crystal display 30 is protected against the harmful effects of excessively high voltage being applied thereto.

Figure 3:
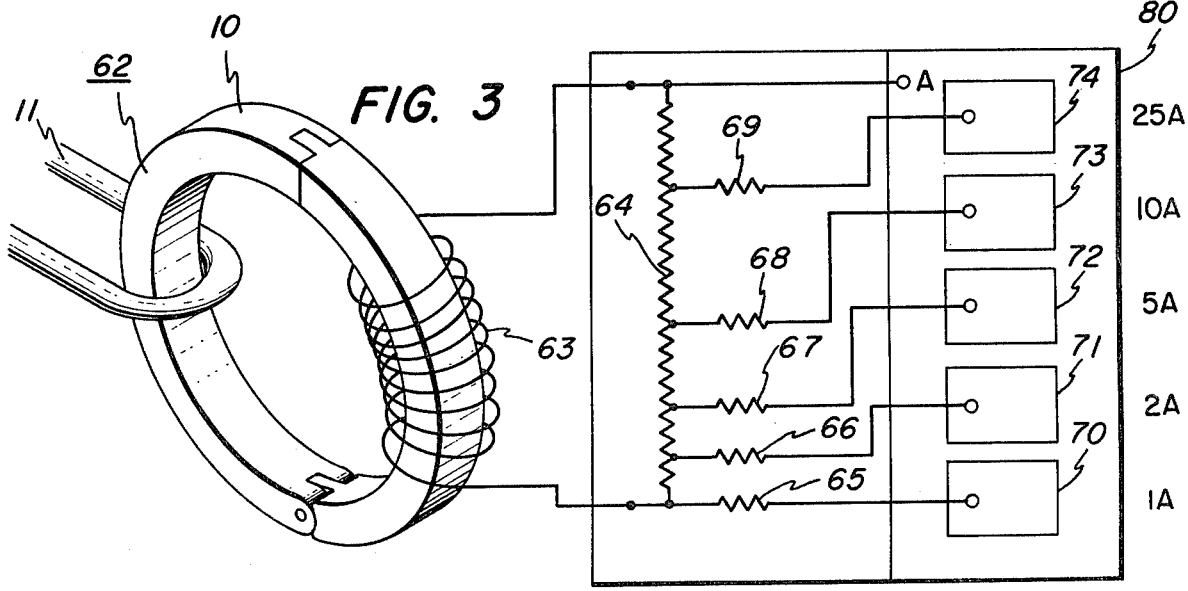
FIG. 3 is a schematic drawing of a third embodiment of the invention employing only one secondary winding on the transformer core.

In FIG. 3, a single secondary winding 63 on a hook-on type core 10 of a transformer 62 is connected to a resistive divider network comprising a parallel-connected resistor 64 having a plurality of tapped locations thereon coupled through resistors 66, 67, 68 and 69, respectively, to bargraph-type segments 71, 72, 73 and 74, respectively, of a liquid crystal display 80. Display 80 may, for example, be fabricated according to the teachings of W. K. Waldron U.S. Pat. No. 4,212,011, issued July 8, 1980 and assigned to the instant assignee. One end of tapped resistor 64 is coupled through a resistor 65 to a bargraph-type segment 70 of liquid crystal display 80, while the other end of tapped resistor 64 is coupled to anode terminal A of liquid crystal display 80. Since the liquid crystal display segments exhibit very high input impedance, the impedance of the resistive network comprising tapped resistor 64 and coupling resistors 65–69 can be made high enough to avoid heavy loading current transformer 62. This allows use of a very large number of turns on secondary winding 63, and the wire employed in such winding can be of very fine diameter. Moreover, by using well-known deposited thin film techniques for fabricating a resistor network concurrently with the liquid crystal display, tapped resistor 64 and coupling resistors 65–69 can be fabricated completely in thin film form, thereby eliminating all but two of the interconnections to bargraph liquid crystal display 80.

Operation of the circuit of FIG. 3 is somewhat similar to that of the circuit shown in FIG. 1. Hence at low current in primary winding 11, the voltage across secondary winding 63 is low, and only the voltage across the entire length of tapped resistor 64 is sufficient to activate segment 70 of liquid crystal display 80, indicative of a 1 amp current in winding 11. As current in primary winding 11 increases, the voltage across secondary winding 63 increases, so that the voltage between anode terminal A and the tap on resistor 64 for coupling resistor 66 is sufficient to activate segment 71 in addition to segment 70, indicative of a 2 amp current in winding 11. As current in primary winding 11 continues to increase, the voltage between anode terminal A and the tap on resistor 64 for coupling resistor 64 becomes sufficient to activate segment 72 in addition to segments 70 and 71 of liquid crystal display 80, indicative of a 5 amp current in winding 11. Further current increases in primary winding 11 produce yet higher voltage across tapped resistor 64 so that the voltage between anode terminal A and the tap on resistor 64 for coupling resistor 68 is sufficient to activate segment 73 in addition to segments 70–72. Finally, as current in primary winding 11 rises further, the voltage between anode terminal A and the tap on resistor 64 for coupling resistor 69 becomes sufficient to activate segment 74 in addition to segments 70–73, indicative of a 25 amp current in winding 11. As current in primary winding 11 diminishes in amplitude, deactivation of bargraph segments 70–74 of liquid crystal display 80 occurs in reverse sequence from that described above for activation of the segments. Those skilled in the art, moreover, will recognize that the voltage protection circuitry shown in FIG. 2 may also be employed in the apparatus of FIG. 3 by including therein the zener diodes 40–49 shown in FIG. 2, connected in a manner similar to that shown and described for the circuit of FIG. 2, and also that the bargraph segments shown in FIG. 3 could, alternatively, be comprised of the alphanumeric segments employed in the embodiments shown in FIGS. 1 or 2.

The foregoing describes a lightweight, low cost, hook-on, digital ammeter for making approximate measurements of alternating current. The ammeter requires no internal power supply of its own and is portable, rugged, and simple to operate.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

We claim:

1. A hook-on digital ammeter comprising:
   an annular magnetic core interrupted at at least one location such that the core material at opposite sides of the interruption is sufficiently separable to allow passage of a conductor through the interruption;
   a secondary winding wound on said core;
   liquid crystal display means comprising a plurality of display segments having a common connection;
   a tapped voltage divider network coupled in parallel with said secondary winding, said tapped network having a terminal coupled to said common connection; and
   resistor means coupling a separate tap, respectively, on said voltage divider network to a separate segment of said liquid crystal display means, respectively.

2. The digital ammeter of claim 1 wherein said voltage divider network comprises a resistive network.

3. The digital ammeter of claim 2 wherein said liquid crystal display means is fabricated on a substrate and wherein said circuit means comprises a thin film resistor network deposited on said substrate.

4. The digital ammeter of claim 2 wherein said display segments comprise bargraph elements.

5. A digital ammeter for measuring alternating current in a conductor, said ammeter comprising:
   an annular magnetic core encircling said conductor carrying alternating current;
   a secondary winding wound on said core;
   a liquid crystal display means comprising a plurality of display segments having a common connection;
   a tapped voltage divider network coupled in parallel with said secondary winding, said tapped network having a terminal coupled to said common connection; and
   resistor means coupling a separate tap, respectively, on said voltage divider network to a separate segment of said liquid crystal display means, respectively.

6. The digital ammeter of claim 5 wherein said voltage divider network comprises a resistive network.

7. The digital ammeter of claim 6 wherein said liquid crystal display means is fabricated on a substrate and wherein said circuit means comprises a thin film resistor network deposited on said substrate.

8. The digital ammeter of claim 5 wherein said display segments comprise bargraph elements.

* * * * *